United States Patent
Park et al.

(10) Patent No.: US 9,985,202 B2
(45) Date of Patent: May 29, 2018

(54) METHOD OF FABRICATING MEMORY DEVICE

(71) Applicant: SAMSUNG ELECTRONICS CO., LTD., Suwon-si, Gyeonggi-do (KR)

(72) Inventors: Jeong-heon Park, Hwaseong-si (KR); Se-chung Oh, Yongin-si (KR); Byoung-jae Bae, Hwaseong-si (KR); Jong-chul Park, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/365,977

(22) Filed: Dec. 1, 2016

(65) Prior Publication Data

US 2017/0263861 A1    Sep. 14, 2017

(30) Foreign Application Priority Data

Mar. 10, 2016    (KR) .................. 10-2016-0029091

(51) Int. Cl.
| | |
|---|---|
| H01L 21/00 | (2006.01) |
| H01L 43/12 | (2006.01) |
| H01L 27/22 | (2006.01) |
| H01L 43/02 | (2006.01) |
| H01L 43/08 | (2006.01) |
| H01L 43/10 | (2006.01) |

(52) U.S. Cl.
CPC .......... *H01L 43/12* (2013.01); *H01L 27/222* (2013.01); *H01L 43/02* (2013.01); *H01L 43/08* (2013.01); *H01L 43/10* (2013.01)

(58) Field of Classification Search
CPC .......... H01L 43/00; H01L 29/82; H01L 27/22
See application file for complete search history.

(56) References Cited

U.S. PATENT DOCUMENTS

| | | |
|---|---|---|
| 7,199,055 B2 | 4/2007 | Chen et al. |
| 8,491,799 B2 | 7/2013 | Jung |
| 9,059,398 B2 | 6/2015 | Kim et al. |
| 9,117,924 B2 | 8/2015 | Kitagawa et al. |
| 9,117,995 B2 | 8/2015 | Daibou et al. |
| 2006/0246604 A1* | 11/2006 | Bae ........................ B82Y 10/00 438/1 |

(Continued)

FOREIGN PATENT DOCUMENTS

| | | |
|---|---|---|
| KR | 10-2014-0038193 A | 3/2014 |
| KR | 10-1549625 B1 | 9/2015 |

OTHER PUBLICATIONS

Read, "Magnesium Boron Oxide Tunnel Barriers", PhD Dissertation (2009).

(Continued)

*Primary Examiner* — Zandra Smith
*Assistant Examiner* — Andre' C Stevenson
(74) *Attorney, Agent, or Firm* — Lee & Morse, P.C.

(57) ABSTRACT

A method of fabricating a memory device, the method including forming a first magnetization layer; forming a tunnel barrier layer on the first magnetization layer; forming a second magnetization layer on the tunnel barrier layer; forming a magnetic tunnel junction (MTJ) structure by patterning the first magnetization layer, the tunnel barrier layer, and the second magnetization layer; and forming a boron oxide in a sidewall of the MTJ structure by implanting boron.

19 Claims, 16 Drawing Sheets

(56) References Cited

U.S. PATENT DOCUMENTS

| | | | |
|---|---|---|---|
| 2013/0069182 A1* | 3/2013 | Ohsawa | H01L 29/82 257/421 |
| 2013/0153848 A1 | 6/2013 | Park et al. | |
| 2015/0044781 A1 | 2/2015 | Tokashiki | |
| 2015/0228321 A1 | 8/2015 | Lee et al. | |
| 2015/0263275 A1 | 9/2015 | Tomioka | |
| 2016/0049581 A1* | 2/2016 | Kim | H01L 43/08 257/421 |

OTHER PUBLICATIONS

Cha, et al., "Atomic-Scale Spectroscopic Imaging of CoFeB/Mg—B—O/CoFeB Magnetic Tunnel Junctions" Appl. Phys. Lett. 95, 032506 (2009).

* cited by examiner

METHOD OF FABRICATING MEMORY DEVICE

CROSS-REFERENCE TO RELATED APPLICATION

Korean Patent Application No. 10-2016-0029091, filed on Mar. 10, 2016, in the Korean Intellectual Property Office, and entitled: "Method of Fabricating Memory Device," is incorporated by reference herein in its entirety.

BACKGROUND

1. Field

Embodiments relate to a method of fabricating a memory device.

2. Description of the Related Art

Much research has been conducted on electronic devices using magneto-resistive characteristics of a magnetic tunnel junction (MTJ). For example, a highly integrated magnetic memory device, which can read/write at high-speed and is non-volatile, has emerged as a next-generation memory device.

SUMMARY

The embodiments may be realized by providing a method of fabricating a memory device, the method including forming a first magnetization layer; forming a tunnel barrier layer on the first magnetization layer; forming a second magnetization layer on the tunnel barrier layer; forming a magnetic tunnel junction (MTJ) structure by patterning the first magnetization layer, the tunnel barrier layer, and the second magnetization layer; and forming a boron oxide in a sidewall of the MTJ structure by implanting boron.

The embodiments may be realized by providing a method of fabricating a memory device, the method including forming a first magnetization layer, a tunnel barrier layer, and a second magnetization layer on a substrate; forming an etching mask pattern on the second magnetization layer; and performing an etching process to form a magnetic tunnel junction (MTJ) structure that includes a first magnetization pattern, a tunnel barrier pattern, and a second magnetization pattern, wherein performing the etching process includes forming etching by-products, and some etching by-products are removed by implanting boron.

The embodiments may be realized by providing a method of fabricating a memory device, the method including forming a first magnetization layer; forming a tunnel barrier layer on the first magnetization layer; forming a second magnetization layer on the tunnel barrier layer; forming a magnetic tunnel junction (MTJ) structure by etching the first magnetization layer, the tunnel barrier layer, and the second magnetization layer such that etching by-products remain on a sidewall of the MTJ structure; and forming a boron-containing material film on the sidewall of the MTJ structure by reacting boron with the etching by-products.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
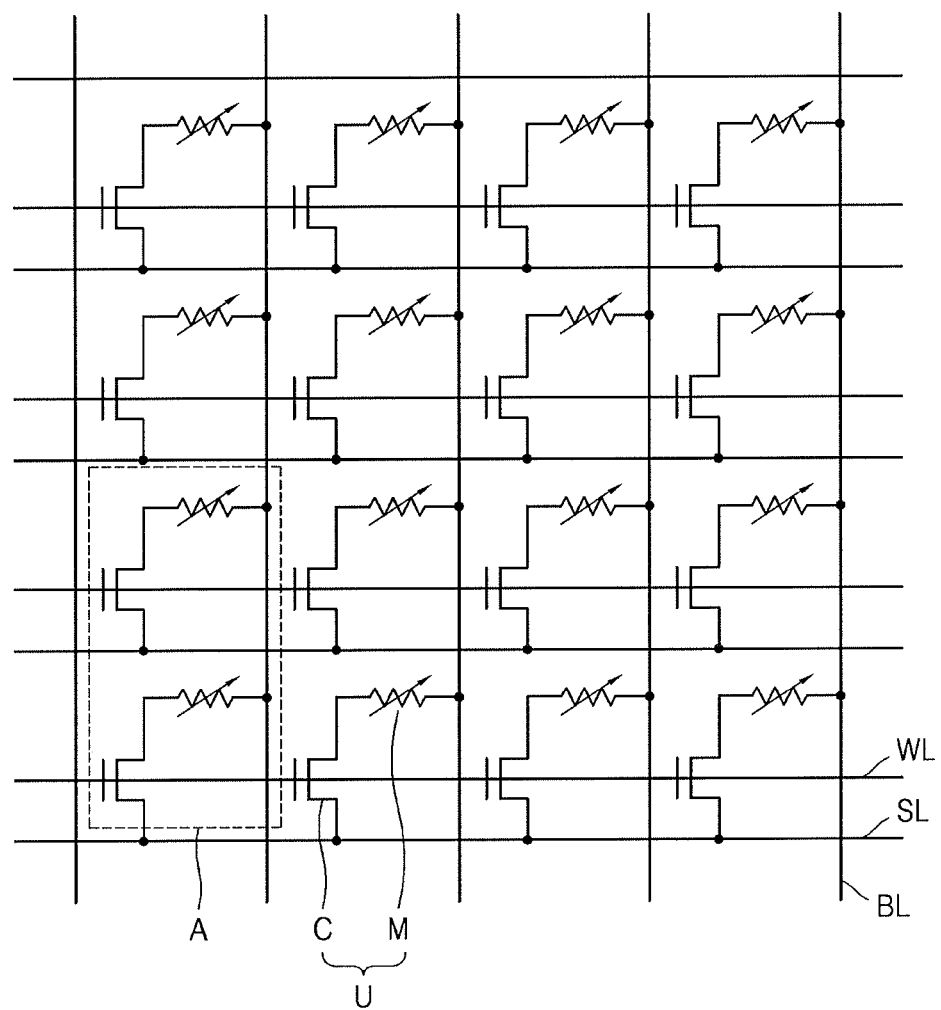
FIG. 1 illustrates a schematic circuit diagram of a magnetic memory array according to an embodiment.

FIG. 1 illustrates a schematic circuit diagram of a magnetic memory array according to an embodiment.

Referring to FIG. 1, the magnetic memory array may include a plurality of magnetic memory devices arranged in a matrix form, each magnetic memory device including a unit cell U. The unit cell U of each of the magnetic memory devices may include an access portion C and a memory portion M. The unit cell U of each of the magnetic memory devices may be electrically connected to a word line WL and a bit line BL. Furthermore, when the access portion C is a transistor as described in FIG. 1, the magnetic memory array may further include a source line SL electrically connected to a source region of the access portion C. The word line WL and the bit line BL may be arranged at a certain angle to each other, e.g., perpendicular to each other. In an implementation, the word line WL and the bit line BL may be arranged at a certain angle to each other, e.g., in parallel to each other.

The access portion C may control current supply to the memory portion M according to a voltage of the word line WL. The access portion C may be a complementary metal oxide silicon (CMOS) transistor, a bipolar transistor, or a diode.

The memory portion M may include a magnetic material and a magnetic tunnel junction (MTJ) structure. In an implementation, the memory portion M may perform a memory function by using a spin transfer torque (STT) phenomenon which changes a magnetization direction of a magnetic substance according to an input current.

Hereinafter, provided are a MTJ structure and a method of fabricating a magnetic memory device according to an embodiment.

FIGS. 2 through 9 illustrate cross-sectional views of stages in a method of fabricating an MTJ structure according to an embodiment.

Figure 2:
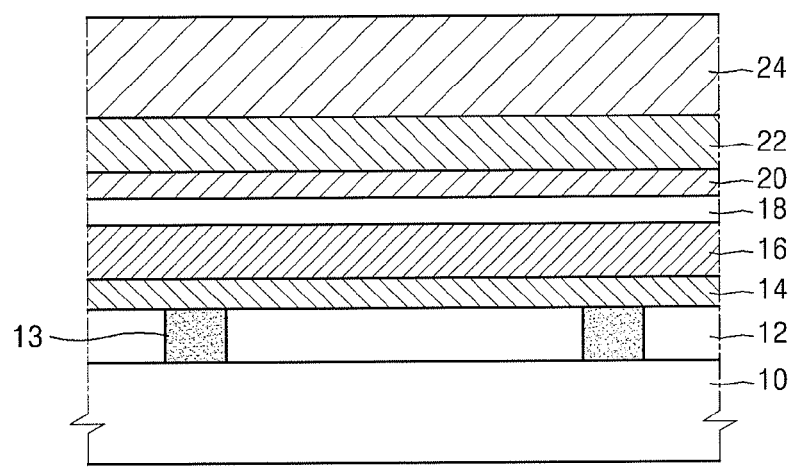
FIGS. 2 through 9 illustrate cross-sectional views of stages in a method of fabricating a magnetic tunnel junction (MTJ) structure according to an embodiment.

Referring to FIG. 2, a lower insulating film 12 may be formed on a substrate 10. The substrate 10 may be a semiconductor substrate. The lower insulating film 12 may include, e.g., a silicon nitride or a silicon oxide. A lower electrode 13 (for electrical connection) may be formed adjacent to the lower insulating film 12. The lower electrode 13 may be formed to be electrically connected to an MTJ structure formed during a subsequent process. In an implementation, the lower electrode 13 may be an isolated pattern type, a film type, a contact plug type, or a cylinder type in which the lower electrode 13 is in the form of a cylinder having an upper ring-shaped surface.

A first electrode film 14 may be formed on the lower insulating film 12. The first electrode film 14 may be formed by depositing a metal material. The metal material may include, e.g., titanium (Ti), titanium nitride (TiN), tantalum (Ta), or tantalum nitride (TaN). As used herein, the term "or" is not an exclusive term, e.g., "A or B" includes any and all combinations thereof, "A", "B", and "A and B". The first electrode film 14 may be formed by laminating one or at least two of the metal materials. The first electrode film 14, which is a pad film interposed between a first magnetization layer 16 to be formed during a subsequent process and the lower electrode 13, may help protect the first magnetization layer 16. In an implementation, the first electrode film 14 may have the same function as the lower electrode 13 during the subsequent process. In an implementation, the first electrode film 14 may be omitted.

The first magnetization layer 16 may be formed on the first electrode film 14. The first magnetization layer 16 may include a magnetic material including a transition metal. A magnetization direction of the first magnetization layer 16 may be vertical. In an implementation, the first magnetization layer 16 may be a fixed layer having a magnetization direction that is fixed vertically. The first magnetization layer 16 may include, e.g., palladium (Pd), cobalt (Co), platinum (Pt), iron (Fe), ruthenium (Ru), tantalum (Ta), nickel (Ni), boron (B), manganese (Mn), antimony (Sb), aluminum (Al), chromium (Cr), molybdenum (Mo), silicon (Si), copper (Cu), iridium (Ir), or alloys thereof. In an implementation, a material included in the first magnetization layer 16 may include, e.g., cobalt-iron (CoFe), nickel-iron (NiFe), or cobalt-iron-boron (CoFeB). The first magnetization layer 16 may be formed by laminating one or more of the materials.

The first magnetization layer 16 may be formed with a film having an appropriate alignment and a reduced crystal defect, and thus, may be formed thicker than other layers in the MTJ structure.

A tunnel barrier layer 18 may be formed on the first magnetization layer 16. The tunnel barrier layer 18 may include an insulating metal oxide. The tunnel barrier layer 18 may include, e.g., magnesium oxide (MgO) or aluminum oxide (AlOx). The tunnel barrier layer 18 may help generate a quantum tunneling phenomenon between the first magnetization layer 16 and a second magnetization layer 20. In an implementation, the tunnel barrier layer 18 may have a small thickness of, e.g., about 1 Å to about 100 Å.

The second magnetization layer 20 may be formed on the tunnel barrier layer 18. The second magnetization layer 20 may include a magnetic material including a transition metal. The second magnetization layer 20 may be a free layer capable of changing its magnetization direction vertically. The second magnetization layer 20 may include, e.g., Pd, Co, Pt, Fe, Ru, Ta, Ni, B, Mn, Sb, Al, Cr, Mo, Si, Cu, Ir, or alloys thereof. A material included in the second magnetization layer 20 may include, e.g., CoFe, NiFe, or CoFeB. The second magnetization layer 20 may be formed by laminating one or more of the materials.

In an implementation, a thickness of the second magnetization layer 20 formed as a free layer may be smaller than that of the first magnetization layer 16. In an implementation, a sum of thicknesses of the first magnetization layer 16, the tunnel barrier layer 18, and the second magnetization layer 20 may be, e.g., about 150 Å to about 400 Å.

In an implementation, the first magnetization layer 16 may be a fixed layer and the second magnetization layer 20 is a free layer. In an implementation, any one of the first magnetization layer 16 and the second magnetization layer 20 may be a fixed layer and the other may be a free layer. In an implementation, the first magnetization layer 16 may be a free layer and the second magnetization layer 20 may be a fixed layer.

In an implementation, each of the first magnetization layer 16 and the second magnetization layer 20 include a material that is vertically magnetized. In an implementation, each of the first magnetization layer 16 and the second magnetization layer 20 may include a material that is horizontally magnetized. For example, the first magnetization layer 16 may include at least one layer including PtMn, IrMn, FePt, or CoPt in a lower portion thereof, and may include a layer including CoFe, NiFe, or CoFeB in an upper portion thereof. Although the first magnetization layer 16 and the second magnetization layer 20 include a material that is horizontally magnetized, an MTJ structure may be formed by identically performing the following processes.

A capping film 22 may be formed on the second magnetization layer 20. A material included in the capping film 22 may include, e.g., Ti, TiN, Ta, or TaN. The capping film 22 may be formed by laminating one or more of the materials.

An upper electrode film 24 may be formed on the capping film 22. The upper electrode film 24 may include, e.g., a metal or a metal nitride. A material included in the upper electrode film 24 may be, e.g., tungsten (W) or WN. A thickness of the upper electrode film 24 may be larger than that of an upper contact plug 270 (see FIG. 15) to be formed on the upper electrode film 24. In an implementation, the thickness of the upper electrode film 24 may be larger than that of the capping film 22.

Figure 3:
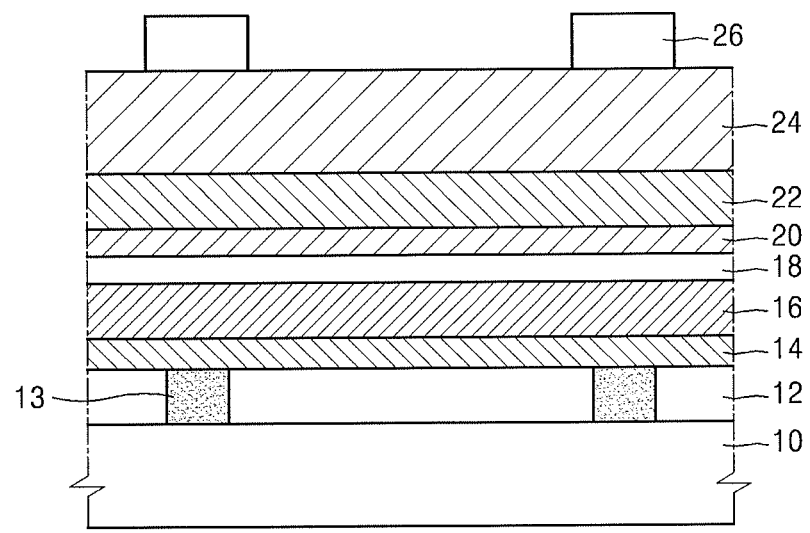

Referring to FIG. 3, a hard mask pattern 26 may be formed on the upper electrode film 24. A process of forming the hard mask pattern 26 may be performed as described below. A photoresist pattern may be formed by forming a hard mask on the upper electrode film 24, coating a photoresist on the hard mask, and performing exposure and development processes. The hard mask pattern 26 may be formed by etching the hard mask by using the photoresist pattern. The hard mask pattern 26 may include, e.g., silicon nitride.

The hard mask pattern 26 may be formed by using, e.g., a double patterning technology (DPT) or a quadruple patterning technology (QPT). The hard mask pattern 26 may be arranged perpendicular to the lower electrode 13 to face each other. The hard mask pattern 26 may be arranged to cover an upper surface of the lower electrode 13.

Figure 4:
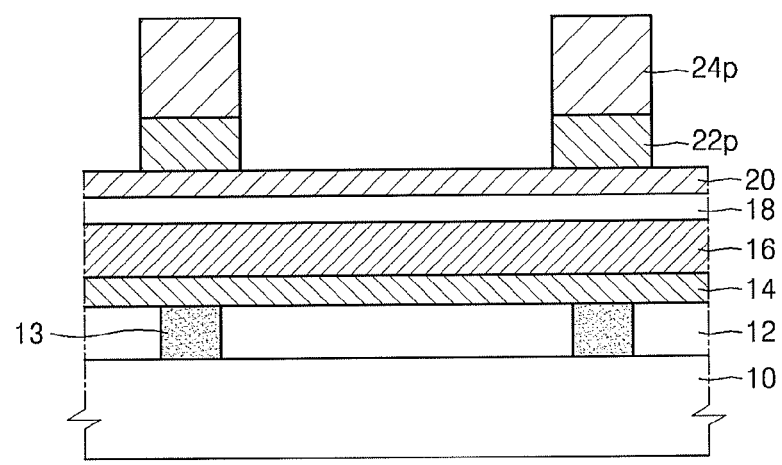

Referring to FIG. 4, by using the hard mask pattern 26 as an etching mask, an upper electrode pattern 24p may be formed by patterning the upper electrode film 24 (of FIG. 3). Next, a capping pattern 22p may be formed by etching the capping film 22 (of FIG. 3). After completing the etching process, the hard mask pattern 26 (of FIG. 3) may be almost or completely removed. Residues of the hard mask pattern 26 after the etching process may be removed.

The upper electrode film 24 and the capping film 22 may be easily etched by using a dry etching process since the upper electrode film 24 and the capping film 22 do not include a magnetic material, and etching by-products may be rarely or never redeposited on the upper electrode film 24 and the capping film 22 during the etching process. The upper electrode film 24 and the capping film 22 may be etched by using, e.g., a reactive ion etching (RIB) process or an ion beam etching (IBE) process. In an implementation, the upper electrode film 24 and the capping film 22 may be etched by using an RIE process using an etching gas. In an implementation, when the upper electrode film 24 and the capping film 22 are etched by using the IBE process, an incident angle of an ion beam may be, e.g., about 60 degrees to about 90 degrees.

Figure 5:
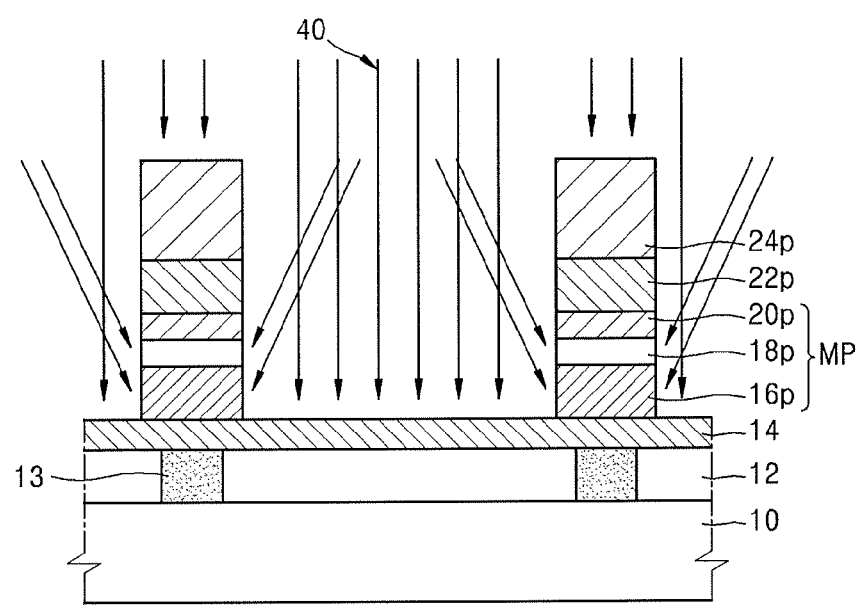

Referring to FIG. 5, by using the upper electrode pattern 24p as a hard mask pattern, the second magnetization layer 20 (of FIG. 4), the tunnel barrier layer 18 (of FIG. 4), and the first magnetization layer 16 (of FIG. 4) may be sequentially etched. Therefore, a first magnetization pattern 16p, a tunnel barrier pattern 18p, and a second magnetization pattern 20p may be formed. Hereinafter, the second magnetization layer 20, the tunnel barrier layer 18, and the first magnetization layer 16 will be described as a layer to be etched. The first magnetization pattern 16p, the tunnel barrier pattern 18p, and the second magnetization pattern 20p will be described as an MTJ structure MP.

The layer to be etched may be etched by using the RIE process or the IBE process, which are each a physical etching process. In an implementation, the etching process may be an RIE process using a reactive etching gas. The reactive etching gas may be an etching gas including, e.g., hydrogen fluoride (HF) and/or ammonia ($NH_3$). In an implementation, the reactive etching gas may further include a reaction gas such as oxygen ($O_2$). In an implementation, the etching process may be an IBE process such as an argon (Ar) ion sputtering method. The IBE process may not use a separate etching gas unlike an RIE process.

The layer to be etched may include a magnetic material, and the layer to be etched may not be easily etched by using a dry etching process. Etching by-products could be redeposited on the layer to be etched during the etching process. Therefore, when an RIE process or an IBE process, which are each a physical etching process, is performed on the layer to be etched, a reactive ion or an ion beam, which exhibits a stronger etching performance compared to when an etching process is performed on the layer to be etched not including a magnetic material, may be used.

It may be difficult for an anisotropy etching process such as an dry etching process to only vertically etch the layer to be etched due to interference between reactive ions in the etching process, or due to a position relationship between an incident angle of an ion beam and the substrate 10. Accordingly, the anisotropy etching process may be performed not only perpendicular to the layer to be etched. For example, arrows 40 indicate the dry etching process.

Figure 6:
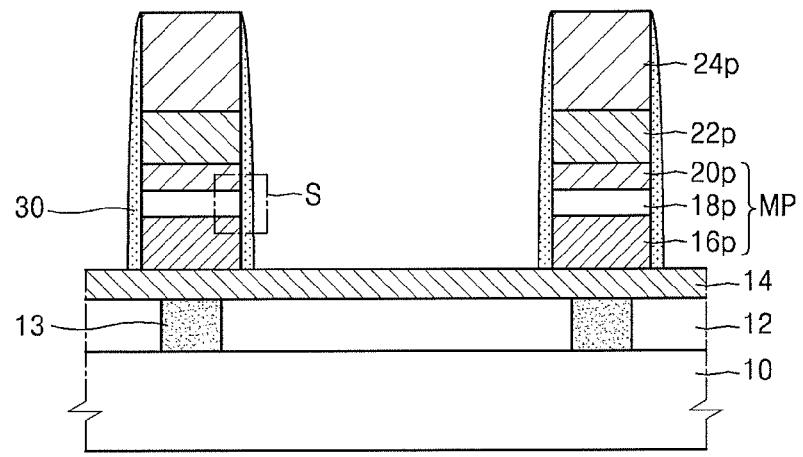

Referring to FIG. 6, when a layer to be etched including a magnetic material is etched, some of the etched material could be redeposited on a sidewall of a pattern structure including an MTJ structure MP. For example, etching by-products 30 could be redeposited on a sidewall of a pattern structure including the MTJ structure MP including the first magnetization pattern 16p, the tunnel barrier pattern 18p, and the second magnetization pattern 20p, which are formed by using an RIE process or an IBE process.

The conductive etching by-products 30 could cause an electrical short circuit phenomenon by being formed on the sidewall of the MTJ structure MP, and could further cause a defect in a magnetic memory device including the MTJ structure MP. The magnetic memory device may include a memory device changing a magnetization direction of a free layer with a quantum tunneling phenomenon through the tunnel barrier pattern 18p between the first magnetization pattern 16p and the second magnetization pattern 20p. Therefore, if the first magnetization pattern 16p and the second magnetization pattern 20p were to be electrically connected to each other without the quantum tunneling phenomenon due to the conductive etching by-products 30, an error could occur in information stored in memory.

As general methods for removing the electrical short circuit phenomenon, optimization of a condition of an RIE process or an IBE process that is an etching process of the MTJ structure MP and optimization of a pre-etching process or a post-etching process may be performed. Such methods may have a limit to completely remove the electrical short circuit phenomenon, and may damage some of electrical or magnetic characteristics of the MTJ structure MP even if the electrical short circuit phenomenon is completely removed.

Therefore, the embodiments provide a method of fabricating a magnetic memory device that helps suppress deterioration of electrical or magnetic characteristics of the MTJ structure MP while substantially or completely removing the electrical short circuit phenomenon.

Figure 7:
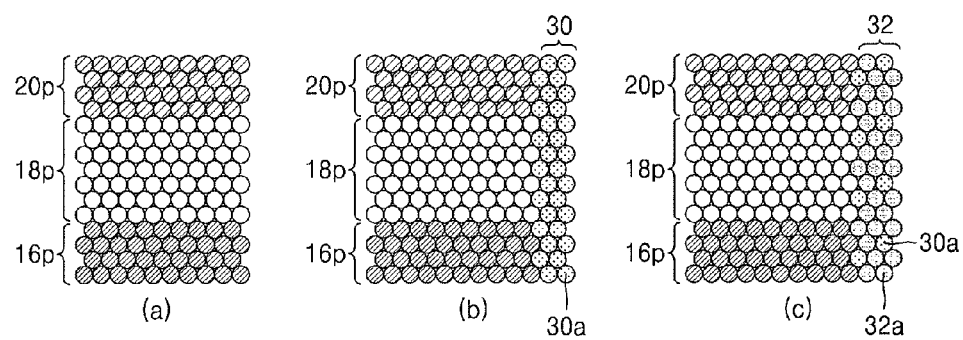

FIG. 7 illustrates a process of forming a non-conductive material film 32 (including boron oxides 32a) on the sidewall of the MTJ structure MP and removing the etching by-products 30, e.g., an enlarged portion S of FIG. 6.

According to an embodiment, boron may be implanted into a sidewall of a pattern structure including the MTJ structure MP at the same time as or after completing the etching process of the MTJ structure MP (of FIG. 6). For example, boron may be included in the MTJ structure MP from the beginning of a forming operation of the MTJ structure MP, and may be mostly captured in the MTJ structure MP or may be exhausted to a peripheral region at random due to heat generated during an annealing process or a post-annealing process. In an implementation, some boron may remain at an interface between the tunnel barrier pattern 18p and the first magnetization pattern 16p, or at an interface between the tunnel barrier pattern 18p and the second magnetization pattern 20p in the form of boron oxide (such as $B_2O_5$ or $B_2O_3$) or some other boron may remain in the tunnel barrier pattern 18p formed of magnesium oxide (MgO) in the form of a stable compound, e.g., Mg—B—O.

If an excessive amount of boron were to remain at the interface between the tunnel barrier pattern 18p and the first magnetization pattern 16p, or at the interface between the tunnel barrier pattern 18p and the second magnetization pattern 20p, a quantum tunneling phenomenon or perpendicular anisotropy energy may be lowered. However, a certain amount of boron may be used to help adjust a magnetization crystallinity and a magnetization direction at the interface between the tunnel barrier pattern 18p and the first magnetization pattern 16p, or at the interface between the tunnel barrier pattern 18p and the second magnetization pattern 20p after the annealing process. A certain concentration of boron proved to be helpful in the MTJ structure MP to optimize characteristics of a magnetic memory device during an actual back end of line (BEOL) process.

According to an embodiment, a process of implanting boron into the etching by-products 30 generated on the sidewall of the MTJ structure MP may include, e.g., a deposition process of a compound including boron, a boron ion implantation process, a plasma treatment process by a gas source containing boron, or an atomic diffusion process by a gas source containing boron.

According to an embodiment, a source for implanting boron into the etching by-products 30 generated on the sidewall of the MTJ structure MP may include, e.g., boron oxide, metal boride, metal boron oxide, boron hydride, boron hydroxide, boron nitride, boron carbide, or triethylborane.

Stages in a method of fabricating a magnetic memory device capable of controlling an electrical short circuit phenomenon without deterioration of characteristics of the MTJ structure MP may be seen in (a), (b), and (c) of FIG. 7.

(a) of FIG. 7 illustrates a schematic view of a state of arrangement of atoms of the first magnetization pattern 16p, the tunnel barrier pattern 18p, and the second magnetization pattern 20p during or after patterning the MTJ structure MP. As described above, after the annealing process, most boron may be captured in a material easily forming boron oxide, and some boron may be distributed in the MTJ structure MP including the tunnel barrier pattern 18p at random. For example, some of the illustrated atoms may be boron.

(b) of FIG. 7 illustrates the etching by-products 30 formed after patterning the MTJ structure MP, and an electrical short circuit phenomenon of the MTJ structure MP could possibly occur due to the conductive etching by-products 30. A thickness of a layer of the etching by-products 30 may be as small as 2 to 4 atomic layers. Conductive elements 30a forming the etching by-products 30 may include a metal element, e.g., Co, Fe, or the like.

(c) of FIG. 7 illustrates the non-conductive material film 32 in which most of the etching by-products 30 formed on the sidewall of the MTJ structure MP after implanting boron are removed. By implanting boron, non-conductive compounds, e.g., Mg—B—O, may be formed on a sidewall of the tunnel barrier pattern 18p, and the non-conductive compounds may help control an electrical short circuit phenomenon due to the etching by-products 30. The non-conductive material film 32 may include, e.g., boron oxides 32a. In an implementation, some of the conductive elements 30a may remain in the non-conductive material film 32, but the conductive elements 30a may not form a connection passage that results in an electrical short circuit phenomenon due to being surrounded or isolated by the non-conductive boron oxides 32a.

Figure 8:
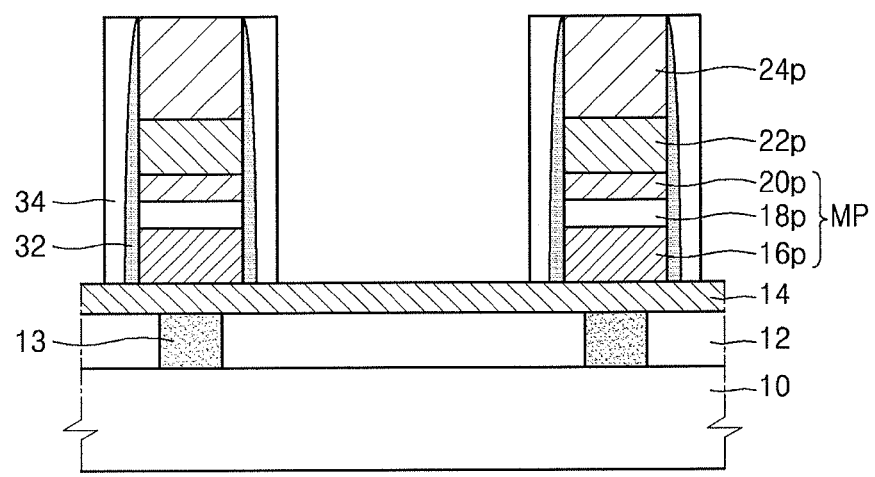

Referring to FIG. 8, a passivation layer 34 may be formed on a sidewall of a pattern structure including the MTJ structure MP, the capping pattern 22p, and the upper electrode pattern 24p, or on the non-conductive material film 32. The passivation layer 34 may include, e.g., a metal oxide formed of oxidized metals included in the MTJ structure MP. The passivation layer 34 may be formed through an oxidation process or a chemical vapor deposition (CVD) process.

Oxidation of the first and second magnetization patterns 16p and 20p may be reduced and/or prevented by the passivation layer 34 formed on the sidewall of the MTJ structure MP. An operation of implanting boron to form the non-conductive material film 32 and an operation of forming the passivation layer 34 may be performed simultaneously or sequentially. For example, a process of implanting boron and a process of forming the passivation layer 34 may be performed simultaneously, or the process of forming the passivation layer 34 may be performed after completing the process of implanting boron.

In an implementation, the process of forming the passivation layer 34 may be omitted.

Figure 9:
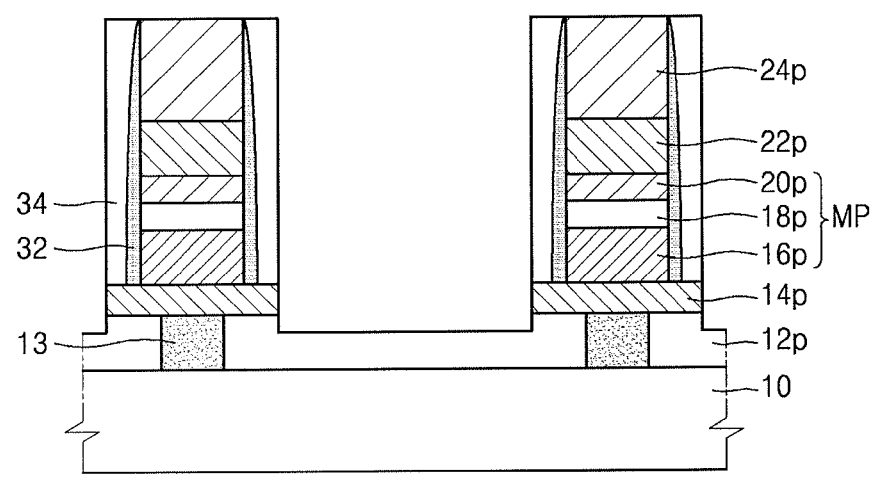

FIG. 9 illustrates a recessed lower insulating film 12p and a first electrode pattern 14p that are formed by etching a part of the lower insulating film 12 and the first electrode film 14. At least a part of each of the first electrode film 14 (of FIG. 8) and the lower insulating film 12 (of FIG. 8) may be etched by keep performing the above etching process. Therefore, the first electrode pattern 14p and the recessed lower insulating film 12p may be formed. The recessed lower insulating film 12p may be over-etched in order to completely pattern the first electrode pattern 14p. According to the processes, a pattern structure including the first electrode pattern 14p, the first magnetization pattern 16p, the tunnel barrier pattern 18p, the second magnetization pattern 20p, the capping pattern 22p, and the upper electrode pattern 24p may be formed. The upper electrode pattern 24p used as the etching mask may remain even after the etching process is completed. Conductive etching by-products could be redeposited on a sidewall of the pattern structure during the etching process of the first electrode film 14 and the lower insulating film 12. However, according to an embodiment, the etching by-products may not directly affect the pattern structure due to the passivation layer 34.

FIGS. 10 through 15 illustrate cross-sectional views of stages in a method of fabricating a memory device according to an embodiment. FIGS. 10 through 15 illustrate a method of fabricating a magnetic memory device in a region A of FIG. 1.

A method of fabricating a memory device according to an embodiment may include fabricating a spin transfer torque-magnetic random access memory (STT-MRAM). The method of fabricating a memory device according to an embodiment may include forming the MTJ structure described above. Therefore, a repeated detailed description of FIGS. 2 through 9 may be omitted here.

Figure 10:
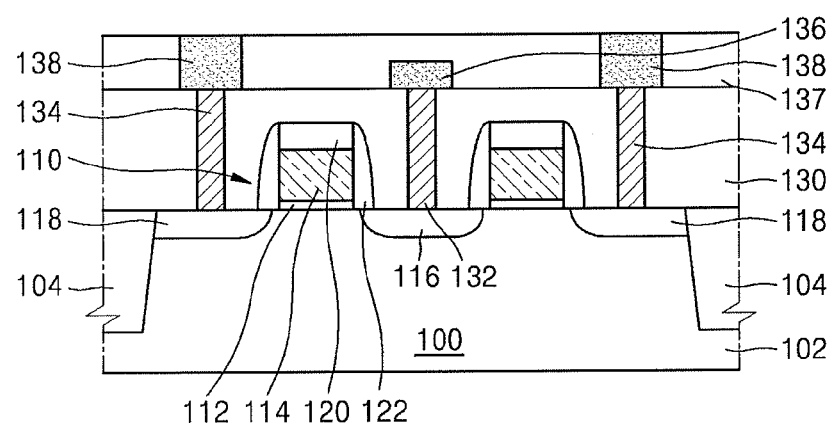
FIGS. 10 through 15 illustrate cross-sectional views of stages in a method of fabricating a memory device according to an embodiment.

Referring to FIGS. 1 and 10, an active region may be defined by forming a device isolation film 104 on a substrate 100 and a transistor 110 may be formed on the active region.

The magnetic memory device may include an MTJ structure NP (of FIG. 15) and the transistor 110. A gate of the transistor 110 may be connected to a word line WL. An electrode of the transistor 110 may be connected to a bit line BL through the MTJ structure NP, and the other electrode of the transistor 110 may be connected to a source line SL. First, a process of fabricating the transistor 110 will be described.

According to exemplary embodiments, the substrate 100 may be a semiconductor substrate such as a Si substrate, a germanium (Ge) substrate, a silicon carbide (SiC) substrate, a gallium arsenic (GaAs) substrate, an indium arsenic (InAs) substrate, or an indium phosphide (InP) substrate. In an implementation, the substrate 100 may include a conductive region, e.g., a well or a structure doped with an impurity. The device isolation film 104 may have a shallow trench isolation (STI) structure.

The transistor 110 may include a gate insulating film 112, a gate electrode 114, a source region 116, and drain regions 118. An upper surface and both sidewalls of the gate electrode 114 may be respectively insulated by an insulating capping pattern 120 and an insulating spacer 122.

A first interlayer insulating film 130 covering the transistor 110 may be formed on the substrate 100, and a plurality of first contact plugs 132 electrically connected to the source region 116 by penetrating through the first interlayer insulating film 130 and second contact plugs 134 electrically connected to the drain regions 118 may be formed. After forming a conductive layer on the first interlayer insulating film 130, a source line 136 electrically connected to the source region 116 by penetrating through the first contact plugs 132 and lower electrodes 138 electrically connected to the drain regions 118 by penetrating through the second contact plugs 134 at both sides of the source line 136 may be formed by patterning the conductive layer.

Next, a lower insulating film 137 may be formed on the first interlayer insulating film 130 to cover the source line 136 and the lower electrodes 138. A part of the lower insulating film 137 may be removed to expose an upper surface of the lower electrodes 138.

In an implementation, the lower electrode 138 may be electrically connected to an MTJ structure formed during a subsequent process. In an implementation, the lower electrode 138 may be an isolated pattern type, a film type, a contact plug type, or a cylinder type in which the lower electrode 138 is in the form of a cylinder having an upper ring-shaped surface.

Figure 11:
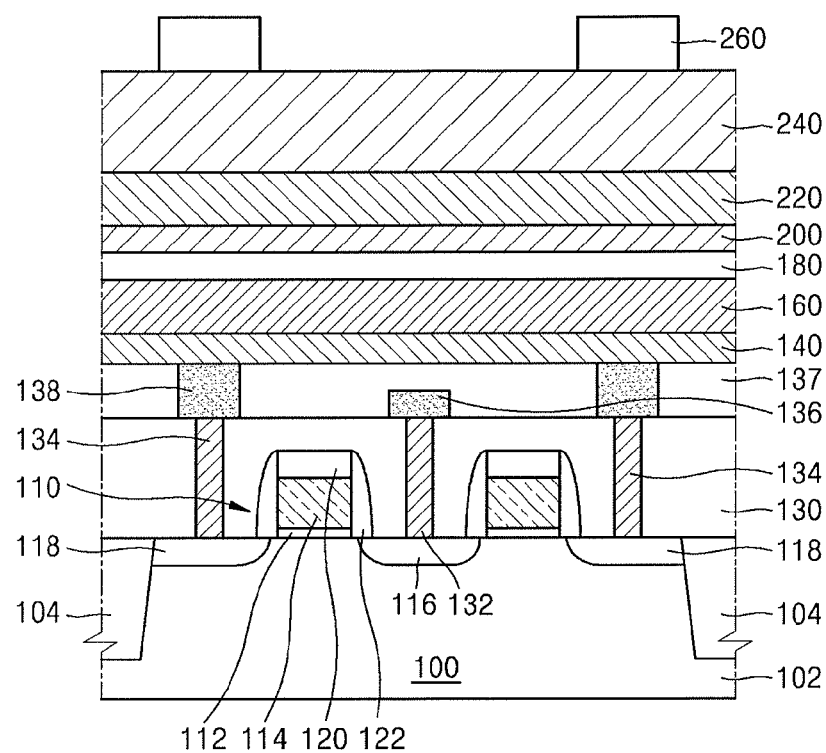

Referring to FIG. 11, a first electrode film 140 may be formed on the lower insulating film 137 and the lower electrodes 138. A first magnetization layer 160 may be formed on the first electrode film 140. A tunnel barrier layer 180 may be formed on the first magnetization layer 160. A second magnetization layer 200 may be formed on the tunnel barrier layer 180. A capping film 220 may be formed on the second magnetization layer 200. An upper electrode film 240 may be formed on the capping film 220. Materials and characteristics of the films are the same as those described in FIG. 2, and thus, repeated detailed descriptions thereof may be omitted.

A hard mask may be formed on the upper electrode film 240. The hard mask may include, e.g., a silicon nitride. A hard mask pattern 260 may be formed by performing a photographic process and an etching process on the hard mask. The hard mask pattern 260 may be formed by using a DPT or a QPT. The hard mask pattern 260 may be arranged perpendicular to the lower electrode 138 to face each other. The hard mask pattern 260 may be arranged to cover an upper surface of the lower electrode 138.

Materials and characteristics of the hard mask pattern 260 are the same as those described in FIG. 3, and thus, repeated detailed descriptions thereof may be omitted.

Figure 12:
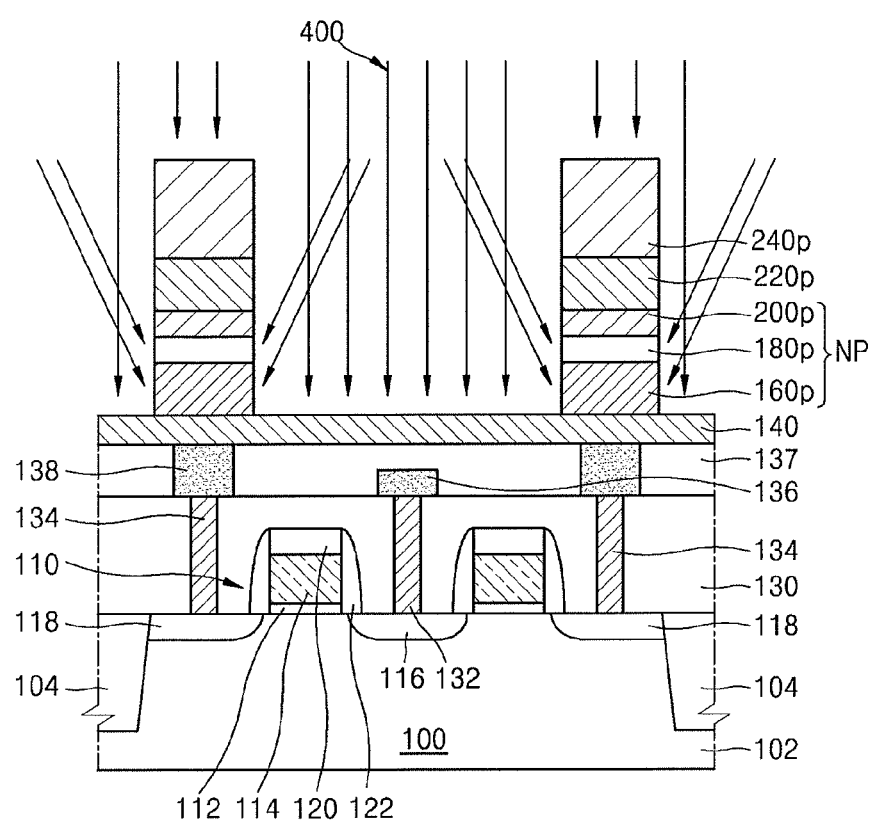

Referring to FIGS. 11 and 12, the upper electrode film 240 may be etched by using the hard mask pattern 260 as an etching mask, and the capping film 220 may be etched. An upper electrode pattern 240p and a capping pattern 220p may be formed by using the etching process. After completing the etching process, the hard mask pattern 260 (of FIG. 11) may be partially or completely removed. The upper electrode film 240 and the capping film 220 may be etched through an RIE process or an IBE process.

By using the upper electrode pattern 240p as a hard mask pattern, the second magnetization layer 200, the tunnel barrier layer 180, and the first magnetization layer 160 may be sequentially etched. Therefore, the MTJ structure NP including a first magnetization pattern 160p, a tunnel barrier pattern 180p, and a second magnetization pattern 200p may be formed. The second magnetization layer 200, the tunnel barrier layer 180, and the first magnetization layer 160 may be etched by using a dry etching process such as an RIE process or an IBE process. Arrows 400 indicate the dry etching process.

Figure 13:
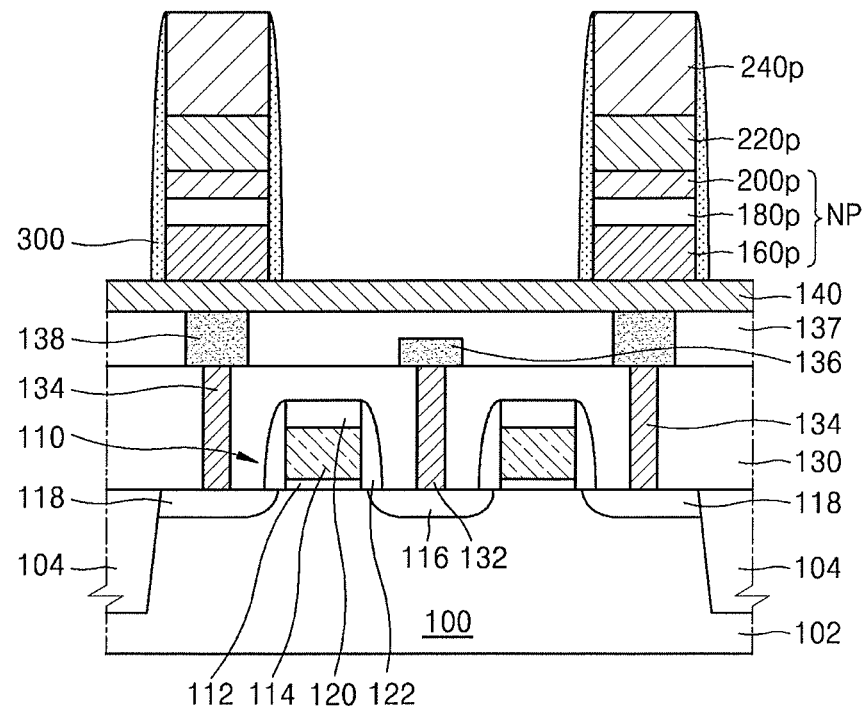

Referring to FIG. 13, when a layer to be etched including a magnetic material is etched, some of etched materials may be redeposited on a sidewall of the MTJ structure NP. For example, etching by-products 300 may be redeposited on a sidewall of the MTJ structure NP including the first magnetization pattern 160p, the tunnel barrier pattern 180p, and the second magnetization pattern 200p, which are formed by using the RIE process or the IBE process. The etching by-products 300 may include a conductive material. If the conductive etching by-products 300 were to remain, they could cause an electrical short circuit phenomenon by being formed on the sidewall of the MTJ structure NP, and could further cause a defect in a magnetic memory device including the MTJ structure NP. The etching by-products 300 may be converted to non-conductive materials as described above. Corresponding descriptions are the same as those described in FIG. 6, and thus, repeated detailed descriptions thereof may be omitted.

Figure 14:
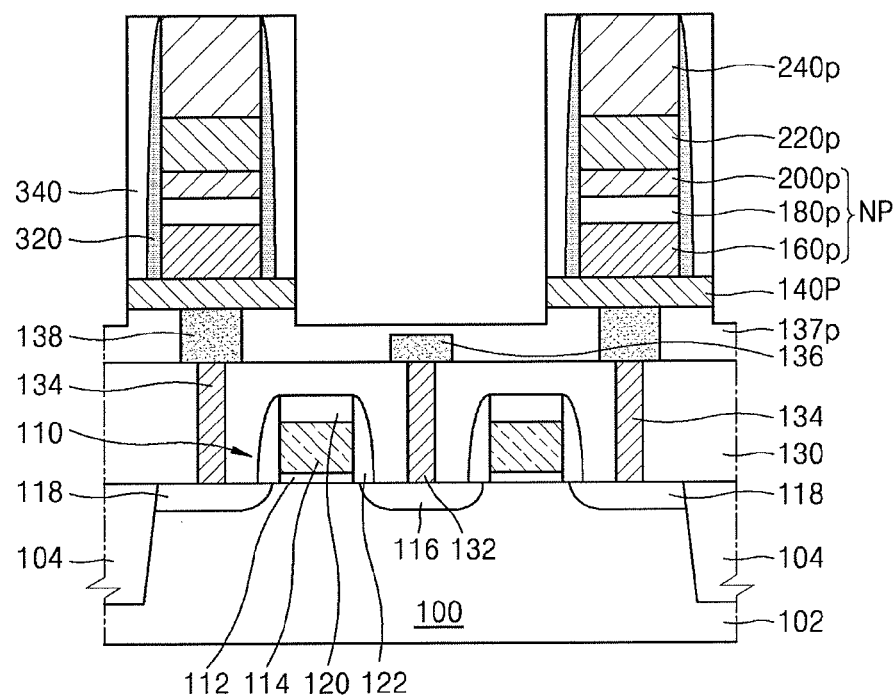

For example, referring to FIG. 14, a non-conductive material film 320 may be formed by implanting boron into the etching by-products 300 (of FIG. 13) on a sidewall of a pattern structure including the MTJ structure NP. A passivation layer 340 may be formed on the non-conductive material film 320. By forming non-conductive compounds, e.g., Mg—B—O, on a sidewall of the tunnel barrier pattern 180p by implanting boron, an electrical short circuit phenomenon due to the etching by-products 300 may be removed.

In an implementation, a process of implanting boron and a process of forming the passivation layer 340 may be performed simultaneously, or the process of forming the passivation layer 340 may be performed after completing the process of implanting boron.

Next, a dry etching process such as an RIE process or an IBE process may be performed by using the upper electrode pattern 240a and the passivation layer 340 as an etching mask. FIG. 14 illustrates a recessed lower insulating film 137p and a first electrode pattern 140p that are formed by etching a part of the lower insulating film 136 (of FIG. 13) and the first electrode film 140. According to an embodiment, the etching by-products 300 generated during the etching process may not directly affect the pattern structure including the MTJ structure NP due to the passivation layer 340.

Materials and characteristics of the non-conductive material film 320 and the passivation layer 340 are the same as those described in FIGS. 7 and 8, and thus, repeated detailed descriptions thereof may be omitted.

Therefore, the non-conductive material film 320 and the passivation layer 340 may help suppress deterioration of electrical or magnetic characteristics of the MTJ structure NP while substantially completely removing or preventing the electrical short circuit phenomenon (which could otherwise be caused by the etching by-products 300).

Figure 15:
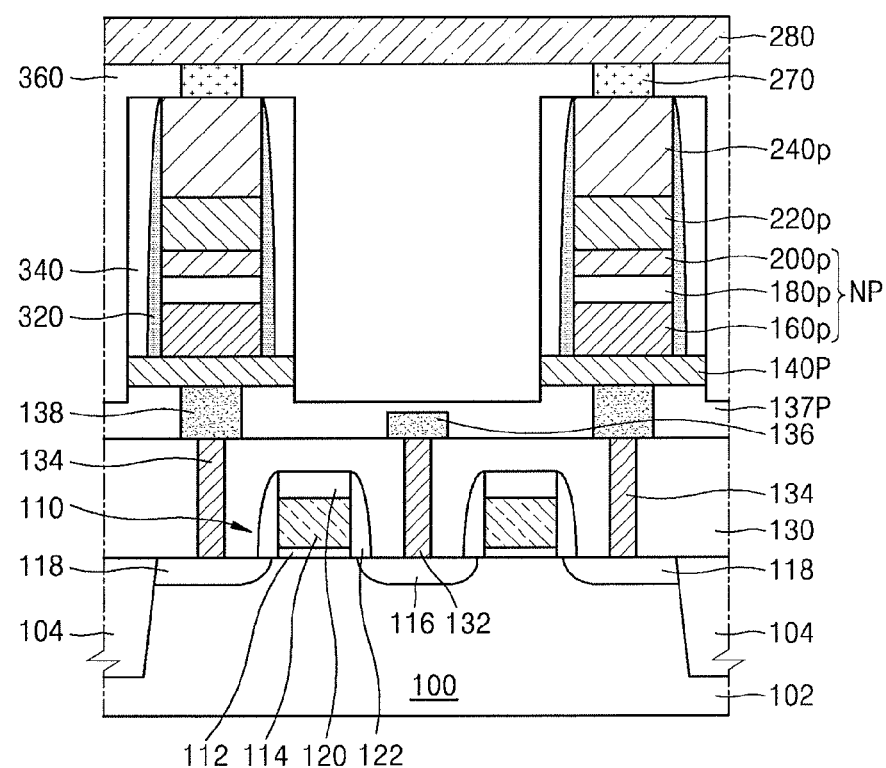

Referring to FIG. 15, a second interlayer insulating film 360 covering the pattern structure including the MTJ structure NP on the recessed lower insulating film 137p may be formed. An upper contact hole (not shown) exposing the upper electrode pattern 240p by penetrating through the second interlayer insulating film 360 may be formed. An upper contact plug 270 may be formed by filling a conductive material in the upper contact hole. The upper contact plug 270 may play a role of an upper electrode contact. The upper contact plug 270 may include a metal material. For example, the upper contact plug 270 may include W, Cu, Al, Ti, TiN, or Ru.

A bit line 280 contacting the upper contact plug 270 and extending on the second interlayer insulating film 360 may be formed. The bit line 280 may include a metal material. For example, the bit line 280 may include W, Cu, Al, Ti, TiN, or Ru. Metal wirings electrically connected to peripheral circuits may further be formed on the bit line 280.

In an implementation, the upper contact plug 270 may be omitted. For example, the bit line 280 may be directly connected to the upper electrode pattern 240p.

According to an embodiment, the MTJ structure NP may be formed by using the same or similar method as the process described above in FIGS. 2 through 9, and the magnetic memory device including the MTJ structure NP may perform the processes described above in FIGS. 10 through 15. Therefore, a magnetic memory device suppressing deterioration of electrical or magnetic characteristics of the MTJ structure NP while substantially completely removing an electrical short circuit phenomenon due to etching by-products may be formed.

Figure 16:
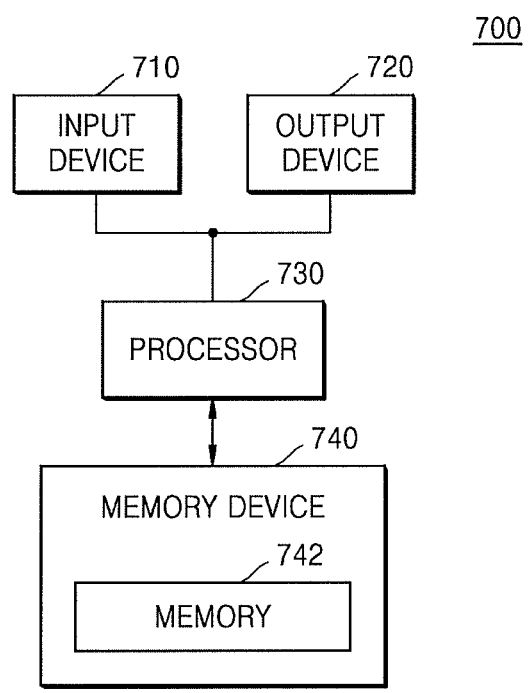
FIG. 16 illustrates a block diagram of an electron system including a memory device fabricated by using a method of fabricating a memory device, according to an embodiment.

FIG. 16 is a block diagram of an electron system 700 including a memory device fabricated by using a method of fabricating a memory device, according to an embodiment.

Referring to FIG. 16, the electronic system 700 may include an input device 710, an output device 720, a processor 730, and a memory device 740. In some embodiments, the memory device 740 may include a cell array including non-volatile memory cells and a peripheral circuit for read/write operations. In some other embodiments, the memory device 740 may include a non-volatile memory device and a memory controller.

A memory 742 included in the memory device 740 may include the memory device fabricated by using the method of fabricating a memory device according to the embodiments of the inventive concept described with reference to FIGS. 2 through 15.

The processor 730 may be connected to each of the input device 710, the output device 720, and the memory device 740 through an interface and may control general operations.

By way of summation and review, a magnetic memory device may include a magnetized transition metal, and thus, an electrical short circuit failure could occur in the MTJ structure due to etching by-products generated during an etching process of the magnetized transition metal.

The embodiments may provide a method of fabricating a memory device that includes reacting boron (B) with etching by-products on a sidewall of a magnetic tunnel junction (MTJ) structure, which may help reduce or prevent an electrical short circuit failure which may occur due to the etching by-products.

The embodiments may provide a method of fabricating a memory device including a process of forming a magnetic tunnel junction (MTJ) structure including a magnetized transition metal used for a magnetic memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a memory device, the method comprising:
   forming a first magnetization layer;
   forming a tunnel barrier layer on the first magnetization layer;
   forming a second magnetization layer on the tunnel barrier layer;
   forming a magnetic tunnel junction (MTJ) structure by patterning the first magnetization layer, the tunnel barrier layer, and the second magnetization layer such that the MTJ includes a first magnetization pattern, a tunnel barrier pattern, and a second magnetization pattern; and
   forming a boron oxide in a sidewall of the first magnetization pattern, the tunnel barrier pattern, and the second magnetization pattern of the MTJ structure by implanting boron.

2. The method as claimed in claim 1, wherein forming the MTJ structure and forming the boron oxide are simultaneously or sequentially performed.

3. The method as claimed in claim 1, wherein implanting boron includes performing an ion implantation process, a plasma treatment process, or an atomic diffusion process.

4. The method as claimed in claim 1, wherein the implanting boron includes using boron oxide, a metal boride, a metal boron oxide, boron hydride, boron hydroxide, boron nitride, boron carbide, or triethylborane.

5. The method as claimed in claim 1, further comprising forming a passivation layer such that the passivation layer surrounds the sidewall of the MTJ structure.

6. The method as claimed in claim 5, wherein forming boron oxide in the sidewall of the MTJ structure and forming the passivation layer are simultaneously or sequentially performed.

7. The method as claimed in claim 5, wherein the boron oxide is formed at an interface between the MTJ structure and the passivation layer.

8. The method as claimed in claim 1, wherein:
   the tunnel barrier layer includes a metal oxide, and
   the boron oxide is chemically bonded to the tunnel barrier layer.

9. The method as claimed in claim 1, wherein forming the boron oxide includes removing etching by-products generated during an operation of forming the MTJ structure.

10. The method as claimed in claim 1, wherein at least one of the first and second magnetization layers include boron.

11. A method of fabricating a memory device, the method comprising:
   forming a first magnetization layer, a tunnel barrier layer, and a second magnetization layer on a substrate;
   forming an etching mask pattern on the second magnetization layer; and
   performing an etching process to form a magnetic tunnel junction (MTJ) structure that includes a first magnetization pattern, a tunnel barrier pattern, and a second magnetization pattern, wherein:
     performing the etching process includes forming etching by-products, and
     some etching by-products are removed by implanting boron such that the etching by-products react with the boron to form boron oxide on a sidewall of the MTJ structure.

12. The method as claimed in claim 11, wherein the etching process includes performing a reactive ion etching process or an ion beam etching process.

13. The method as claimed in claim 11, wherein the etching by-products are conductive materials.

14. The method as claimed in claim 11, wherein implanting boron prevents a short circuit caused by etching by-products between the first and second magnetization patterns.

15. A method of fabricating a memory device, the method comprising:
   forming a first magnetization layer;
   forming a tunnel barrier layer on the first magnetization layer;
   forming a second magnetization layer on the tunnel barrier layer;
   forming a magnetic tunnel junction (MTJ) structure by etching the first magnetization layer, the tunnel barrier layer, and the second magnetization layer such that etching by-products remain on a sidewall of the MTJ structure; and
   forming a boron-containing material film on the sidewall of the MTJ structure by reacting boron with the etching by-products.

16. The method as claimed in claim 15, wherein at least one of the first and second magnetization layers include boron.

17. The method as claimed in claim 15, wherein the etching by-products are conductive materials.

18. The method as claimed in claim 15, wherein the boron-containing material film is non-conductive.

19. A memory device fabricated according to the method as claimed in claim 15.

\* \* \* \* \*